(12) United States Patent
Huh et al.

(10) Patent No.: US 9,387,510 B2
(45) Date of Patent: Jul. 12, 2016

(54) SUBSTRATE PROCESSING APPARATUS AND SUBSTRATE PROCESSING METHOD

(71) Applicants: Song Whe Huh, Seongnam-si (KR); Jeung Hoon Han, Gwangju-si (KR)

(72) Inventors: Song Whe Huh, Seongnam-si (KR); Jeung Hoon Han, Gwangju-si (KR)

(73) Assignee: Jusung Engineering Co., Ltd, Gwangju-si (KR)

( * ) Notice: Subject to any disclaimer, the term of this patent is extended or adjusted under 35 U.S.C. 154(b) by 31 days.

(21) Appl. No.: 14/366,231

(22) PCT Filed: Dec. 21, 2012

(86) PCT No.: PCT/KR2012/011228
§ 371 (c)(1),
(2) Date: Jun. 17, 2014

(87) PCT Pub. No.: WO2013/095030
PCT Pub. Date: Jun. 27, 2013

(65) Prior Publication Data
US 2014/0363587 A1      Dec. 11, 2014

(30) Foreign Application Priority Data

Dec. 23, 2011   (KR) .................. 10-2011-0141796

(51) Int. Cl.
| | |
|---|---|
| *B05D 3/04* | (2006.01) |
| *C23C 16/509* | (2006.01) |
| *H01L 21/687* | (2006.01) |

(Continued)

(52) U.S. Cl.
CPC .............. *B05D 3/044* (2013.01); *C23C 16/509* (2013.01); *H01J 37/3244* (2013.01); *H01J 37/32366* (2013.01); *H01J 37/32449* (2013.01); *H01J 37/32733* (2013.01); *H01L 21/02* (2013.01); *H01L 21/02057* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| | | |
|---|---|---|
| 8,069,817 B2 | 12/2011 | Fischer et al. |
| 2007/0163440 A1 | 7/2007 | Kim et al. |
| 2008/0242085 A1 | 10/2008 | Fischer et al. |

(Continued)

FOREIGN PATENT DOCUMENTS

| | | |
|---|---|---|
| KR | 10-0646017 B1 | 11/2006 |
| KR | 10-0682077 B1 | 2/2007 |

(Continued)

OTHER PUBLICATIONS

Soo, KR100646017, Nov. 2006, Eng mach translation.*

(Continued)

*Primary Examiner* — Joseph Miller, Jr.
(74) *Attorney, Agent, or Firm* — Andrew D. Fortney; Central California IP Group, P.C.

(57) ABSTRACT

Disclosed is a substrate processing apparatus and method which facilitate to improve uniformity of thin film material and also facilitate to control quality of thin film by the use of plasma forming space and source gas distributing space separately provided from each other, wherein the substrate processing apparatus includes a process chamber; a substrate support for supporting a plurality of substrates, the substrate support rotatably provided inside the process chamber; and a electrode unit arranged above the substrate support and provided with the plasma forming space and the source gas distributing space, wherein the plasma forming space is spatially separated from the source gas distributing space.

14 Claims, 7 Drawing Sheets

(51) Int. Cl.
*H01J 37/32* (2006.01)
*H01L 21/02* (2006.01)

(56) References Cited

U.S. PATENT DOCUMENTS

2009/0078204 A1* 3/2009 Kerr .................. C23C 16/45551
 118/728
2011/0083602 A1* 4/2011 Bergmann .......... C23C 16/4584
 117/107

FOREIGN PATENT DOCUMENTS

| KR | 10-0874341 B1 | 12/2008 |
| KR | 10-2011-0051043 A | 5/2011 |
| KR | 10-2011-0080458 A | 7/2011 |

OTHER PUBLICATIONS

Abstract for KR 100646017; http://worldwide.espacenet.com; Nov. 7, 2006.
Abstract for KR 100682077; http://worldwide.espacenet.com; Feb. 6, 2007.
Abstract for KR 100874341; http://worldwide.espacenet.com; Dec. 16, 2008.
Sung Hyun Park and Hyung Il Kim; "Apparatus for Atomic Layer Deposition"; May 17, 2011; Abstract of KR20110051043 (A); www.worldwide.espacenet.com.
Sang Jin Lee, Dong Ho Ryu and Chang Hee Han; "Apparatus Depositing Thin Film and Method of Depositing Thin Film Using Ozone Plasma";Jul. 13, 2011; Abstract of KR20110080458 (A); www.worldwide.espacenet.com.

* cited by examiner

SUBSTRATE PROCESSING APPARATUS AND SUBSTRATE PROCESSING METHOD

CROSS REFERENCE TO RELATED APPLICATIONS

This application claims the benefit of the Korean Patent Application No. 10-2011-0141796 filed on Dec. 23, 2011, which is hereby incorporated by reference as if fully set forth herein.

BACKGROUND

1. Field of the Disclosure

The present invention relates to a substrate processing apparatus, and more particularly, to a substrate processing apparatus and method which facilitate to improve uniformity of thin film material and also facilitate to control quality of thin film by the use of plasma space and source gas distributing space separately provided from each other.

2. Discussion of the Related Art

Generally, in order to manufacture a solar cell, a semiconductor device and a flat panel display device, it is necessary to form a predetermined thin film layer, a thin film circuit pattern or an optical pattern on a surface of substrate. To this end, a semiconductor manufacturing process may be carried out, for example, a thin film deposition process of depositing a thin film of a predetermined material on a substrate, a photo process of selectively exposing the thin film by the use of photosensitive material, and an etching process of forming a pattern by selectively removing an exposed portion of the thin film. The semiconductor manufacturing process is performed inside a substrate processing apparatus designed to be suitable for optimal circumstances. Recently, a substrate processing apparatus using plasma is generally used to carry out a deposition or etching process.

This substrate processing apparatus using plasma may be a PECVD (Plasma Enhanced Chemical Vapor Deposition) apparatus for forming a thin film, and a plasma etching apparatus for etching and patterning the thin film.

FIG. 1 illustrates a substrate processing apparatus according to the related art.

Referring to FIG. 1, the substrate processing apparatus according to the related art may include a chamber 10, a plasma electrode 20, a susceptor 30, and a gas distributing means 40.

The chamber 10 provides a reaction space for substrate processing. In this case, a predetermined portion of a bottom surface of the chamber 10 is communicated with an exhaust port 12 for discharging gas from the reaction space.

The plasma electrode 20 is provided over the chamber 10 so as to seal the reaction space.

One side of the plasma electrode 20 is electrically connected with a RF (Radio Frequency) power source 24 through a matching member 22. The RF power source 24 generates RF power of 40 MHz, and supplies the generated RF power to the plasma electrode 20. Also, a central portion of the plasma electrode 20 is communicated with a gas supply pipe 26 supplying source gas for the substrate processing. The matching member 22 is connected between the plasma electrode 20 and the RF power source 24, to thereby match load impedance and source impedance of the RF power supplied from the RF power source 24 to the plasma electrode 20.

The susceptor 30 is provided inside the chamber 10, and the susceptor 30 supports a plurality of substrates (W) loaded from the external. The susceptor 30 corresponds to an opposite electrode in opposite to the plasma electrode 20, and the susceptor 30 is electrically grounded by an elevating axis 32 for elevating the susceptor 30.

The elevating axis 32 moves upward or downward by an elevating apparatus (not shown). In this case, the elevating axis 32 is surrounded by a bellows 34 for sealing the bottom surface of the chamber 10, whereby the elevating axis 32 together with the bellow 34 seals the bottom surface of the chamber 10.

The gas distributing means 40 is provided below the plasma electrode 20, wherein the gas distributing means 40 confronts the susceptor 30. In this case, a gas diffusion space 42 is formed between the gas distributing means 40 and the plasma electrode 20, wherein source gas supplied from the gas supply pipe 26 penetrating through the plasma electrode 20 is diffused in the gas diffusion space 42. The gas distributing means 40 uniformly distributes the source gas to the entire area of the reaction space through a plurality of gas distributing holes 44 being communicated with the gas diffusion space 42.

In case of the substrate processing apparatus according to the related art, after the substrate (W) is loaded onto the susceptor 30, the predetermined source gas is distributed to the reaction space of the chamber 10, and an electromagnetic field is formed in the reaction space by the RF power supplied to the plasma electrode 20, whereby plasma is formed on the substrate (W) by the electromagnetic field, thereby forming the predetermined thin film on the substrate (W).

However, in case of the substrate processing apparatus according to the related art, the space for distributing the source gas is the same as the space for forming the plasma. Thus, uniformity in the thin film material deposited on the substrate (W) depends on plasma density uniformity formed in the reaction space, which might cause difficulty in controlling quality of the thin film formed on the substrate (W).

SUMMARY

Accordingly, embodiments of the present invention are directed to a substrate processing apparatus and method that substantially obviate one or more problems due to limitations and disadvantages of the related art.

An aspect of embodiments of the present invention is directed to provide a substrate processing apparatus and method which facilitate to improve uniformity of thin film material and also facilitate to control quality of thin film by the use of plasma space and source gas distributing space separately provided from each other.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a substrate processing apparatus that may include a process chamber; a substrate support for supporting a plurality of substrates, the substrate support rotatably provided inside the process chamber; and a electrode unit arranged above the substrate support and provided with a plasma forming space for forming plasma to the substrate and a source gas distributing space for distributing source gas onto the substrate, wherein the plasma forming space is spatially separated from the source gas distributing space.

There are the plurality of plasma forming spaces and the plurality of source gas distributing spaces, wherein each source gas distributing space is formed between each of the plasma forming spaces so as to spatially separate the plurality of plasma forming spaces from one another.

Also, the electrode unit further includes a plurality of purge gas distributing spaces for distributing purge gas onto the substrate, wherein each of the purge gas distributing spaces is prepared in between a pair of plasma forming spaces prepared in between a pair of neighboring source gas distributing spaces, or prepared between the plasma forming space and the source gas distributing space while being spatially separated.

In another aspect of an embodiment of the present invention, there is provided a substrate processing method that may include (A) placing a plurality of substrates onto a substrate support rotatably provided in a process chamber; (B) rotating the substrate support onto which the plurality of substrates are placed; (C) supplying source gas to a source gas distributing space, which is formed in a electrode unit being electrically grounded and is spatially separated from a plasma forming space prepared in the electrode unit, and distributing the source gas onto the substrate; and (D) forming plasma in the plasma forming space and forming the plasma toward the substrate.

The above step (D) may include supplying reaction gas to the plasma forming space; and supplying plasma power to the plasma forming space.

Also, the above step (D) may further include supplying purge gas to the plasma forming space.

In addition, the substrate processing method may further include a step (E) for supplying purge gas to the purge gas distributing space prepared in the electrode unit so as to spatially separate the plasma forming space and the source gas distributing space from each other, and distributing the purge gas onto the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

Hereinafter, a substrate processing apparatus according to the embodiment of the present invention will be described with reference to the accompanying drawings.

Figure 1:
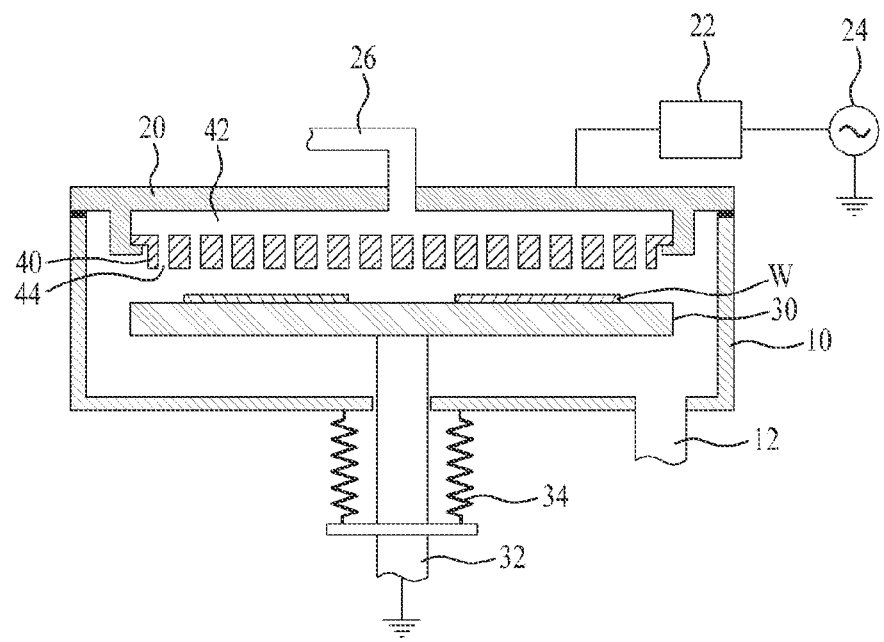
FIG. 1 illustrates a substrate processing apparatus according to the related art.
Figure 2:
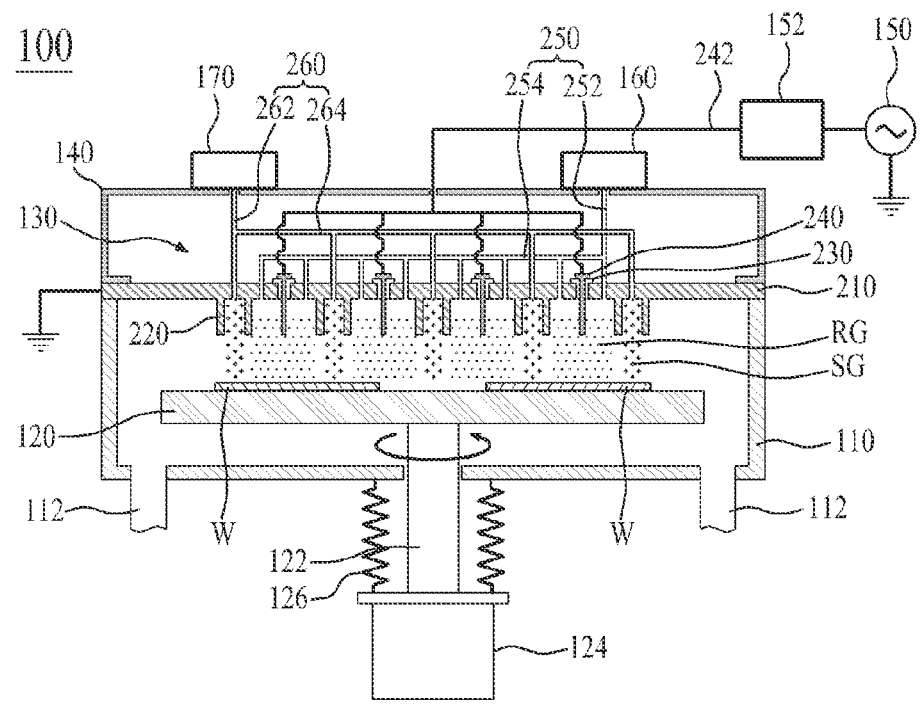
FIG. 2 illustrates a substrate processing apparatus according to the first embodiment of the present invention.
Figure 3:
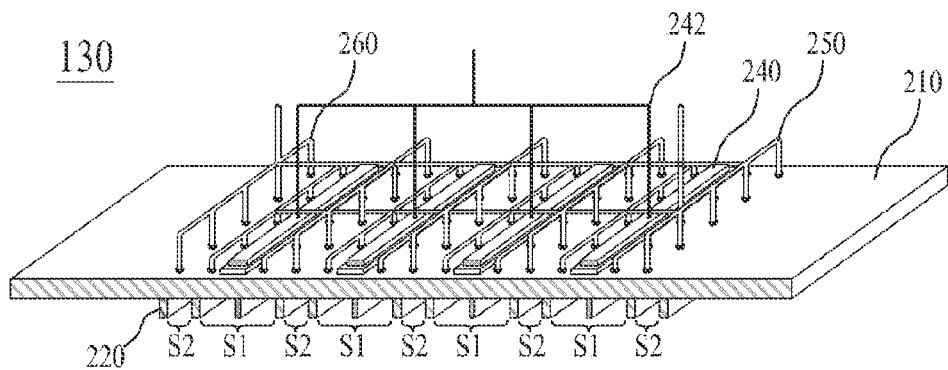
FIG. 3 is a perspective view showing a electrode unit of FIG. 2.
Figure 4:
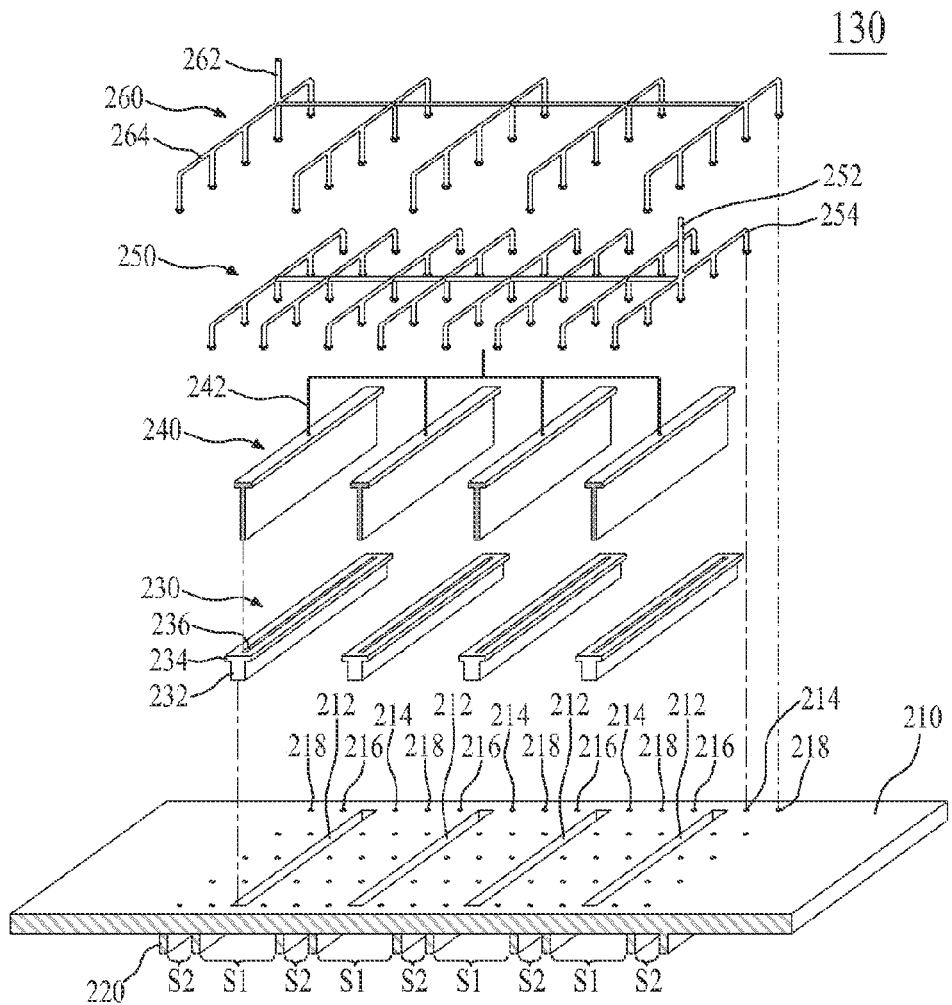
FIG. 4 is an exploded perspective view showing a electrode unit of FIG. 3.

FIG. 2 illustrates a substrate processing apparatus according to the first embodiment of the present invention. FIG. 3 is a perspective view showing a electrode unit of FIG. 2. FIG. 4 is an exploded perspective view showing a electrode unit of FIG. 3.

Referring to FIGS. 2 to 4, the substrate processing apparatus according to the first embodiment of the present invention may include a process chamber 110, a substrate support 120, a electrode unit 130, a electrode cover 140, a plasma power supplier 150, a reaction gas supplier 160, and a source gas supplier 170.

The process chamber 110 provides a reaction space for substrate processing. In this case, a bottom surface of the process chamber 110 may be communicated with an exhaust port 112 for discharging gas from the reaction space.

The substrate support 120 may be rotatably provided inside the process chamber 110. The substrate support 120 may be supported by a rotating axis 122 penetrating through a central portion of the bottom surface of the process chamber 110. According as the rotating axis 122 is rotated by driving an axis driving member 124, the substrate support 120 is rotated in a predetermined direction. The rotating axis 122 exposed out of the bottom surface of the process chamber 100 to the external is covered by a bellows 126 provided in the bottom surface of the process chamber 110.

The substrate support 120 supports a plurality of substrates (W) loaded by an external substrate loading apparatus (not shown). The substrate support 120 may be formed in shape of a circular plate. The substrate (W) may be a semiconductor substrate or a wafer. Preferably, the plurality of substrates (W) may be arranged at fixed intervals in a circular pattern on the substrate support 120.

The electrode unit 130 is provided on the process chamber 110, wherein the electrode unit 130 confronts the substrate support 120. In this case, the electrode unit 130 is covered by the electrode cover 140. The electrode unit 130 is provided for forming plasma onto the substrate (W) through a plasma forming space (S1), and also distributing source gas (SG) onto the substrate (W) through a source gas distributing space (S2) spatially separated from the plasma forming space (S1). In this case, there may be the plurality of plasma forming spaces (S1), and each source gas distributing space (S2) may be formed between each of the source gas forming spaces (S1) so as to spatially separate the plurality of plasma forming spaces (S1) from each other.

In detail, as shown in FIGS. 3 and 4, the electrode unit 130 may include a ground frame 210, a plurality of space forming members 220, a plurality of insulating members 230, a plurality of plasma electrode members 240, a reaction gas supply member 250, and a source gas supply member 260.

The ground frame 210 is provided on the process chamber 110 so as to cover the process chamber 110, whereby the ground frame 210 confront the plurality of substrates (W) supported by the substrate support 120. The ground frame 210 is electrically grounded.

The ground frame 210 may include a plurality of insertion holes 212, and a plurality of first to third gas supply holes 214, 216 and 218.

Each of the insertion holes 212 overlaps with a central portion in each of the plasma forming spaces (S1). In this case, each of the insertion holes 212 is formed in a rectangular shape.

Each of the first gas supply holes 214 is overlapped with each of the plasma forming spaces (S1) while being adjacent to one side of each of the insertion holes 212. In this case, each of the first gas supply holes 214 is provided in parallel to a longitudinal direction of each of the plural insertion holes 212.

Each of the second gas supply holes 216 is overlapped with each of the plasma forming spaces (S1) while being adjacent to the other side of each of the insertion holes 212. In this case, each of the second gas supply holes 216 is provided in parallel to a longitudinal direction of each of the plural insertion holes 212.

Each of the third gas supply holes 218 is overlapped with each of the source gas distributing spaces (S2) while being adjacent to one side of each of the plural first gas supply holes 214 or the other side of each of the plural second gas supply holes 216. In this case, each of the third gas supply holes 218 is provided in parallel to each of the plural first or second gas supply holes 214 or 216.

Each of the space forming members 220 protrudes with a predetermined height from a lower surface of the ground frame 210, which overlaps with a portion between the first and second gas supply holes 214 and 216 or a portion between the second and third gas supply holes 216 and 218, toward the substrate support 120, to thereby prepare the plurality of plasma forming spaces (S1) and the plurality of source gas distributing spaces (S2) which are spatially separated from each other. In this case, each of the plural space forming members 220 is provided in parallel to a longitudinal direction of each of the plural insertion holes 212. Accordingly, each plasma forming space (S1) overlaps with each insertion hole 212 and the first and second gas supply holes 214 and 216 being adjacent to both sides of the longitudinal direction of each insertion hole 212. Each of the source gas distributing spaces (S2) is prepared between each of the plasma forming spaces (S1) while being overlapped with each of the third gas supply holes 218. The plurality of space forming members 220 are integrated with the electrically-grounded ground frame 210 so that the plurality of source gas distributing spaces (S2) make the plurality of plasma forming spaces (S1) electrically separated from one another.

Each of the insulating members 230, which is formed of an insulating material, is inserted into each of the insertion holes 212 formed in the ground frame 210. To this end, each of the insulating members 230 has a T-shaped cross section. Each of the insulating members 230 may include a body 232 inserted into the insertion hole 212 of the ground frame 210, a head 234 formed on an upper surface of the body 232 and supported by an upper surface of the ground frame 210, and an opening 236 penetrating through the head 234 and the body 232. Each of the insulating member 230 electrically insulates the ground frame 210 from the plasma electrode member 240 to be described later.

Each of the plasma electrode members 240 is formed of an electrically conducting material. Each of the plasma electrode members 240 which is inserted into the opening 236 of the insulating member 230 protrudes at a predetermined height out of the lower surface of the ground frame 210, whereby each of the plasma electrode members 240 is positioned in the plasma forming space (S1). Preferably, a protruding height for each of the plasma electrode members 240 is the same as a height for each of the space forming members 220. To this end, each of the plasma electrode members 240 has a T-shaped cross section. Each of the plasma electrode members 240 is electrically connected with the plasma power supplier 150 via a feed cable 242.

The reaction gas supply member 250 supplies reaction gas, which is supplied from the reaction gas supplier 160, to the plurality of first and second gas supply holes 214 and 216 formed in the ground frame 210, whereby the reaction gas is distributed to each of the plasma forming spaces (S1) through the plurality of first and second gas supply holes 214 and 216. To this end, the reaction gas supply member 250 may include a first main gas pipe 252, and a plurality of first branch gas pipes 254.

The first main gas pipe 252 penetrating through the electrode cover 140 is connected with the reaction gas supplier 160.

Each of the first branch gas pipes 254 is diverged from the first main gas pipe 252, and is then combined with the ground frame 210 while being communicated with the plurality of first and second gas supply holes 214 and 216 formed in the ground frame 210.

The source gas supply member 260 supplies source gas, which is supplied from the source gas supplier 170, to the plurality of third gas supply holes 218 formed in the ground frame 210, whereby the source gas is distributed to each of the source gas distributing spaces (S2) through the plurality of third gas supply holes 218. To this end, the source gas supply member 260 may include a second main gas pipe 262, and a plurality of second branch gas pipes 264.

The second main gas pipe 262 penetrating through the electrode cover 140 is connected with the source gas supplier 170.

Each of the second branch gas pipes 264 is diverged from the second main gas pipe 262, and is then combined with the ground frame 210 while being communicated with the plurality of third gas supply holes 218 formed in the ground frame 210.

The plasma power supplier 150 generates plasma power having a predetermined frequency, and then supplies the generated plasma power to each of the plasma electrode members 240 of the electrode unit 130 via the feed cable 242. In this case, the plasma power may be High Frequency (HF) power or Very High Frequency (VHF) power. For example, the HF power may have a frequency range of 3 MHz~30 MHz, and the VHF power may have a frequency range of 30 MHz~300 MHz.

The feed cable 242 is connected with an impedance matching circuit 152 for matching load impedance and source impedance of the plasma power supplied from the plasma power supplier 150 to each of the plasma electrode members 240. The impedance matching circuit 152 may include at least two of impedance element (not shown) formed of at least one selected from the group consisting of capacitor and inductor.

The reaction gas supplier 160 supplies the reaction gas to each of the plasma forming spaces (S1) of the electrode unit 130. To this end, the reaction gas supplier 160 may be provided on an upper surface of the electrode cover 140 or outside the process chamber 110, and be communicated with each of the plasma forming spaces (S1) of the electrode unit 130 through the aforementioned reaction gas supply member 250. In this case, the reaction gas may be gas which reacts with the source gas (SG). For example, the reaction gas may be at least one selected from the group consisting of nitrogen (N2), oxygen (O2), nitrogen dioxide (NO2) or ozone (O3). The reaction gas becomes a plasma state by the plasma generated in the plasma forming space (S1), and then the reaction gas of the plasma state is distributed onto the substrate (W). As the reaction gas of the plasma state distributed onto the substrate (W) reacts with the source gas (SG) distributed onto the substrate (W), a desired thin film material is deposited on the substrate (W).

The source gas supplier 170 supplies the source gas to each of the source gas distributing spaces (S2) of the electrode unit 130. To this end, the source gas supplier 170 may be provided on an upper surface of the electrode cover 140 or outside the process chamber 110, and be communicated with each of the source gas distributing spaces (S2) of the electrode unit 130 through the aforementioned source gas supply member 260. In this case, the source gas (SG) may contain a thin film material to be deposited on the substrate (W), for example, silicon (S1), titanium family element (Ti, Zr, Hf, and etc.), or aluminum (Al). For example, the source gas (SG) containing silicon (S1) may be Silane (SiH4), Disilane (Si2H6), Trisilane (Si3H8), TEOS (Tetraethylorthosilicate), DCS (Dichlorosilane), HCD (Hexachlorosilane), TriDMAS (Tri-dimethylaminosilane), TSA (Trisilylamine), and etc. As the source gas (SG) reacts with the aforementioned reaction gas (RG), the desired thin film material is deposited on the substrate (W), to thereby form the thin film on the substrate (W).

Figure 5:
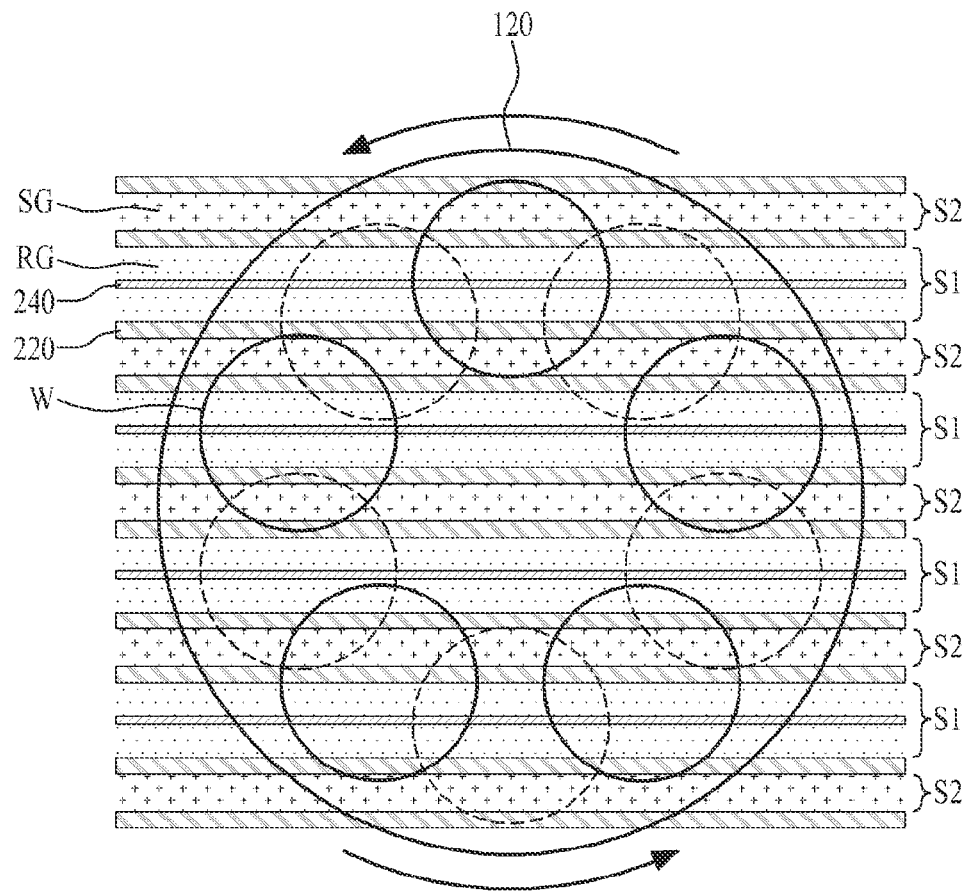
FIGS. 5 and 6 are views for explaining a substrate processing method using the substrate processing apparatus according to the first embodiment of the present invention.
Figure 6:
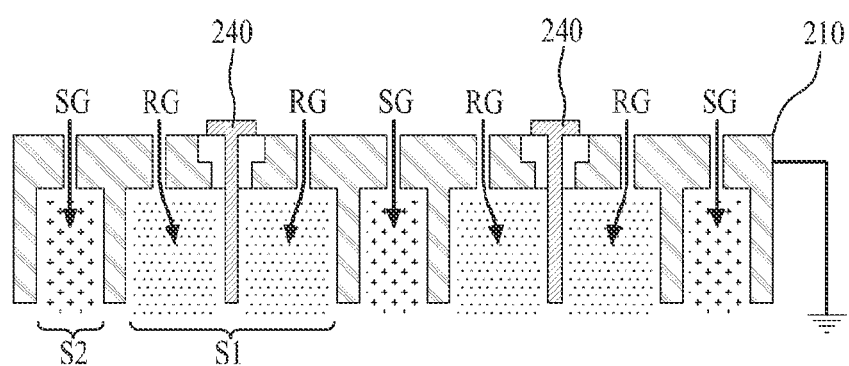

FIGS. 5 and 6 are views for explaining a substrate processing method using the substrate processing apparatus according to the first embodiment of the present invention.

Referring to FIGS. 5 and 6, the substrate processing method using the substrate processing apparatus according to the first embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 130, and is then distributed toward a lower side for each of the source gas distributing spaces (S2), whereby the source gas (SG) is distributed onto the plurality of substrates (W) rotated in accordance with the rotation of the substrate support 120.

Then, the plasma power is supplied to each of the plasma electrode members 240 prepared in the electrode unit 130, and the reaction gas (RG) is supplied to each of the plasma forming spaces (S1) so as to form the plasma for each of the plasma forming spaces (S1), whereby the reaction gas of the plasma state in the plasma forming space (S1) is formed (or jetted) toward the substrate (W). In this case, the reaction gas of the plasma state is formed to a lower side for each of the plasma forming spaces (S1) by a flux (or flow) of the reaction gas (RG) supplied to the plasma forming space (S1). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby the predetermined thin film material is deposited on the substrate (W).

In the above substrate processing apparatus and method, the steps for distributing the source gas (SG) and forming the plasma may be carried out at the same time, or may be carried out in sequence.

The above substrate processing apparatus and method according to the first embodiment of the present invention improves step coverage of the thin film material and facilitates to control quality of the thin film by spatially separating the plasma forming space (S1) and the source gas distributing space (S2) prepared in the electrode unit 130 arranged above an entire upper side of the substrate support 120 for rotating the plurality of substrates (W), and also improves use efficiency of the source gas (SG) and uniformity of the thin film material by preventing the thin film material from being deposited in the surroundings of plasma forming space (S1) and/or plasma electrode member 240 or minimizing the deposition of thin film material in the surroundings of plasma forming space (S1) and/or plasma electrode member 240.

Figure 7:
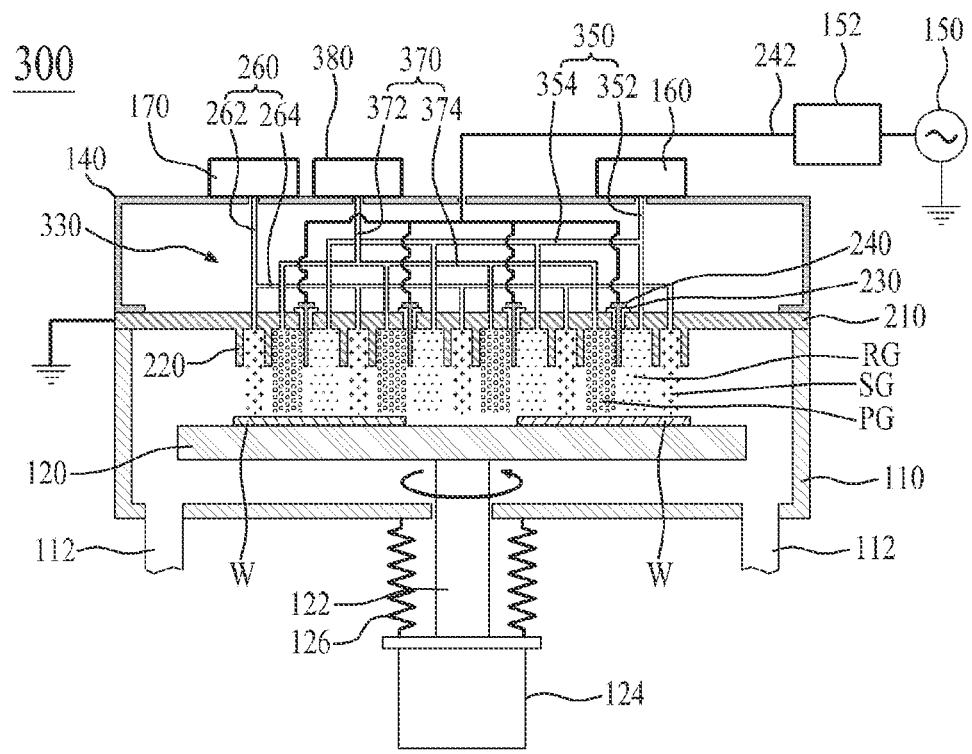
FIG. 7 illustrates a substrate processing apparatus according to the second embodiment of the present invention.
Figure 8:
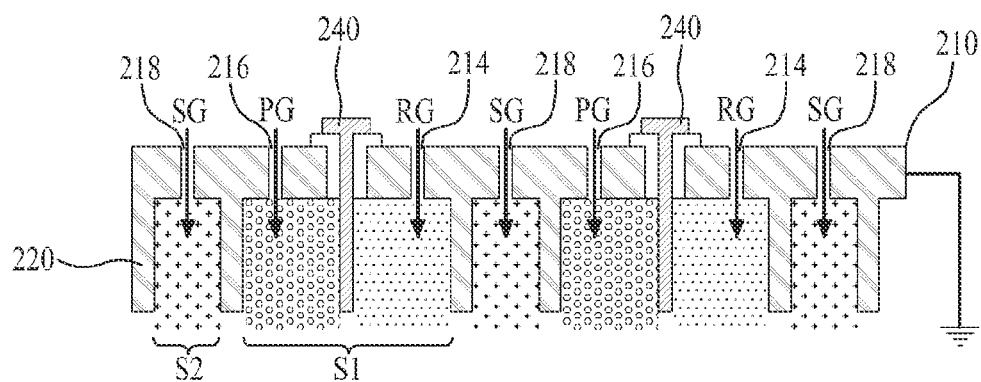
FIG. 8 is a cross sectional view showing some portions of a electrode unit shown in FIG. 7.

FIG. 7 illustrates a substrate processing apparatus according to the second embodiment of the present invention. FIG. 8 is a cross sectional view showing some portions of a electrode unit shown in FIG. 7.

Referring to FIGS. 7 and 8, the substrate processing apparatus 300 according to the second embodiment of the present invention may include a process chamber 110, a substrate support 120, a electrode unit 330, a electrode cover 140, a plasma power supplier 150, a reaction gas supplier 160, a source gas supplier 170, and a purge gas supplier 380. Except the electrode unit 330 and the purge gas supplier 380, the substrate processing apparatus 300 according to the second embodiment of the present invention is identical in structure to the substrate processing apparatus 100 according to the first embodiment of the present invention, whereby a detailed description for the same parts will be omitted.

The electrode unit 330 is formed to have a plurality of plasma forming spaces (S1) and a plurality of source gas distributing spaces (S2). The electrode unit 330 may include a ground frame 210, a plurality of space forming members 220, a plurality of insulating members 230, a plurality of plasma electrode members 240, a reaction gas supply member 350, a source gas supply member 260, and a purge gas supply member 370. Except the reaction gas supply member 350 and the purge gas supply member 370, the remaining structures of the electrode unit 330 are the same as those of the electrode unit 130 shown in FIGS. 3 and 4, whereby a detailed description for the same parts will be omitted.

The reaction gas supply member 350 supplies the aforementioned reaction gas (RG), which is supplied from the reaction gas supplier 160, to a plurality of first gas supply holes 214 formed in the ground frame 210, whereby the reaction gas (RG) is distributed to one side for each of the plasma forming spaces (S1) through the plurality of first gas supply holes 214 formed in the ground frame 210. To this end, the reaction gas supply member 350 may include a first main gas pipe 352, and a plurality of first branch gas pipes 354.

The first main gas pipe 352 penetrating through the electrode cover 140 is connected with the reaction gas supplier 160.

Each of the first branch gas pipes 354 is diverged from the first main gas pipe 352, and is then combined with the ground frame 210 while being communicated with the plurality of first gas supply holes 214 formed in the ground frame 210.

The purge gas supply member 370 supplies purge gas (PG), which is supplied from the purge gas supplier 380, to the plurality of second gas supply holes 216 formed in the ground frame 210, whereby the purge gas (PG) is distributed to the other side for each of the plasma forming spaces (S1) through the plurality of second gas supply holes 216 formed in the ground frame 210. To this end, the purge gas supply member 370 may include a third main gas pipe 372, and a plurality of third branch gas pipes 374.

The third main gas pipe 372 penetrating through the electrode cover 140 is connected with the purge gas supplier 380.

Each of the third branch gas pipes 374 is diverged from the third main gas pipe 372, and is then combined with the ground frame 210 while being communicated with the plurality of second gas supply holes 216 formed in the ground frame 210.

The purge gas supplier 380 may be provided in the electrode cover 140 or provided outside the process chamber 110. The purge gas supplier 380 supplies the predetermined purge gas (PG) to the purge gas supply member 370. In this case, the purge gas (PG) purges the source gas (SG) which is not deposited on the substrate (W), and/or the remaining reaction gas (RG) which does not react with the source gas (SG). The purge gas may be at least any one kind of gas among nitrogen (N2), argon (Ar), xenon (Ze) and helium (He).

Hereinafter, a substrate processing method using the substrate processing apparatus according to the second embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 330, and is then distributed toward a lower side for each of the source gas distributing spaces (S2), whereby the source gas (SG) is distributed onto the plurality of substrates (W) rotated in accordance with the rotation of the substrate support 120.

Then, plasma power is supplied to each of the plasma electrode members 240 prepared in the electrode unit 330, and the reaction gas (RG) is supplied to one side for each of the plasma forming spaces (S1) so as to form the plasma for each of the plasma forming spaces (S1), whereby the reaction gas of the plasma state in the plasma forming space (S1) is formed toward the substrate (W). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby the predetermined thin film material is deposited on the substrate (W).

After stopping the supply of plasma power to each of the plasma electrode members 240 prepared in the electrode unit 330, the purge gas (PG) is supplied to each of the plasma forming spaces (S1), whereby the purge gas (PG) is distributed to a lower side for each of the plasma forming spaces (S1). Thus, the purge gas (PG) is distributed onto the plurality of substrates (W) rotated in accordance with the rotation of the substrate support 120. The purge gas (PG) purges the source gas (SG) which is not deposited on the substrate (W), and/or the remaining reaction gas (RG) which does not react with the source gas (SG).

In the aforementioned substrate processing apparatus and method, the steps for distributing the source gas (SG), forming the plasma and distributing the purge gas (PG) may be carried out at the same time, or may be carried out in sequence. During the step for distributing the purge gas (PG), the plasma power together with the purge gas (PG) may be supplied to each plasma electrode member 240 so as to form the plasma for each of the plasma forming spaces (S1), whereby the purge gas of plasma state may be formed toward the substrate (W).

Figure 9:
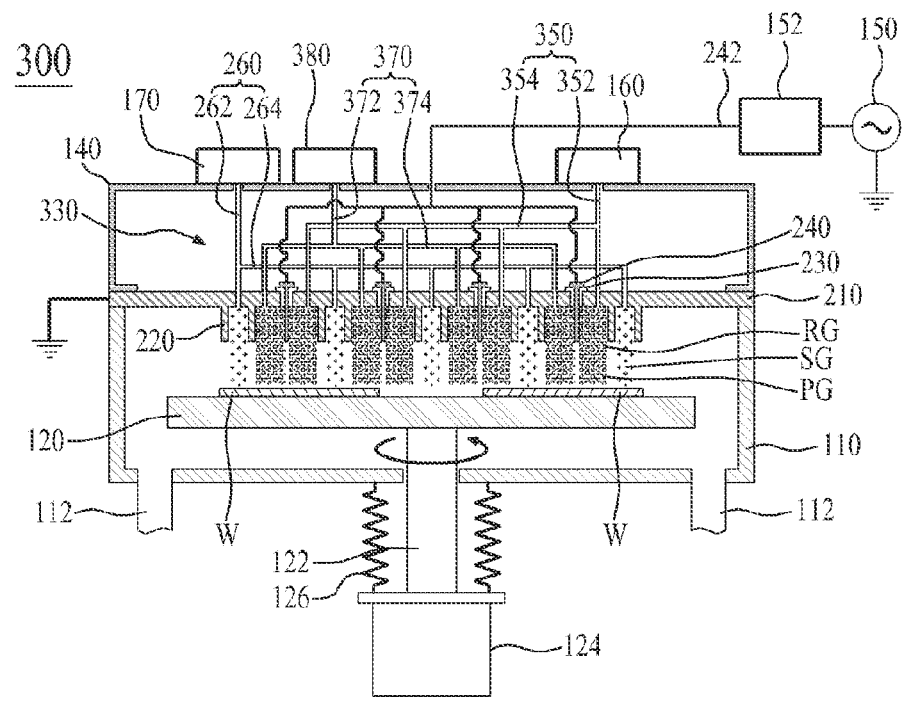
FIG. 9 illustrates a modified embodiment of the substrate processing apparatus according to the second embodiment of the present invention.
Figure 10:
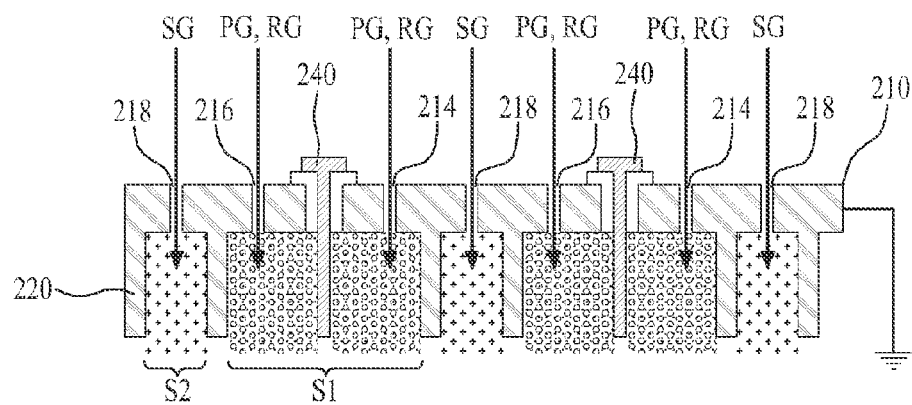
FIG. 10 is a cross sectional view showing some portions of a electrode unit shown in FIG. 9.

Meanwhile, in the aforementioned substrate processing apparatus and method, the purge gas (PG) and the reaction gas (RG) may be separately provided through the respective gas supply holes 214 and 216, and supplied to each of the plasma forming spaces (S1), but not necessarily. The purge gas (PG) and the reaction gas (RG) may be supplied through the same gas supply hole 214 and 216. To this end, as shown in FIGS. 9 and 10, the aforementioned reaction gas supply member 350 is communicated with some of the first gas supply holes 214, and also communicated with some of the second gas supply holes 216. The aforementioned purge gas supply member 370 is communicated with the remaining holes among the first gas supply holes 214, and also communicated with the remaining holes among the second gas supply holes 216. Accordingly, the purge gas (PG) together with the reaction gas (RG) may be supplied to the plurality of plasma forming spaces (S1) through the plurality of first gas supply holes 214 and the plurality of second gas supply holes 216. In another way, the aforementioned reaction gas supply member 350 and the aforementioned purge gas supply member 370 may be communicated with each other so that the purge gas (PG) and the reaction gas (RG) may be supplied to the plurality of plasma forming spaces (S1) through the plurality of first gas supply holes 214 and the plurality of second gas supply holes 216.

The above substrate processing apparatus and method according to the second embodiment of the present invention improves step coverage of the thin film material, facilitates to control quality of the thin film and improves use efficiency of the source gas (SG) and uniformity of the thin film material by spatially separating the plasma forming space (S1) and the source gas distributing space (S2) prepared in the electrode unit 330 arranged above an entire upper side of the substrate support 120 for rotating the plurality of substrates (W), and furthermore facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

Figure 11:
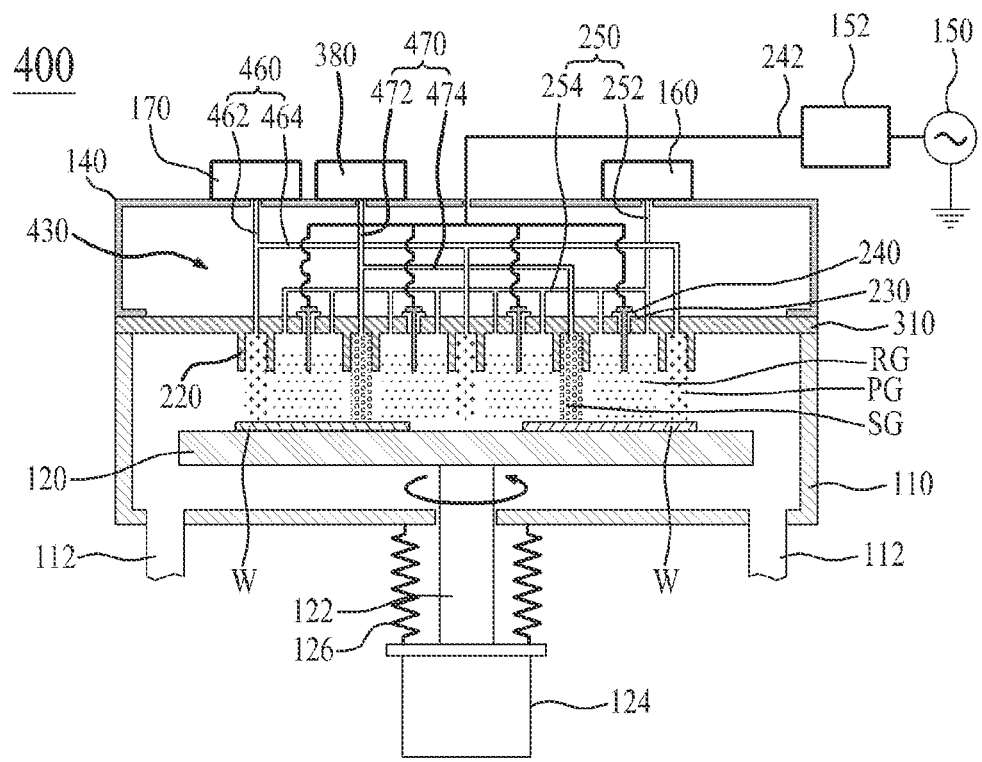
FIG. 11 illustrates a substrate processing apparatus according to the third embodiment of the present invention.
Figure 12:
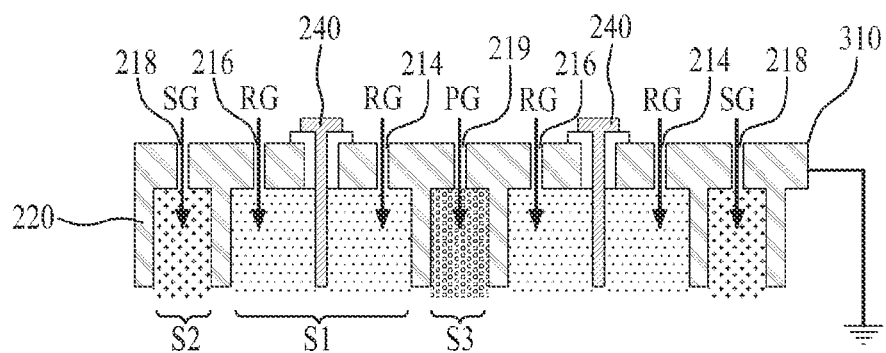
FIG. 12 is a cross sectional view showing some portions of a electrode unit shown in FIG. 11.

FIG. 11 illustrates a substrate processing apparatus according to the third embodiment of the present invention. FIG. 12 is a cross sectional view showing some portions of a electrode unit shown in FIG. 11.

Referring to FIGS. 11 and 12, the substrate processing apparatus 400 according to the third embodiment of the present invention may include a process chamber 110, a substrate support 120, a electrode unit 430, a electrode cover 140, a plasma power supplier 150, a reaction gas supplier 160, a source gas supplier 170, and a purge gas supplier 380. Except the electrode unit 430 and the purge gas supplier 380, the substrate processing apparatus 400 according to the third embodiment of the present invention is identical in structure to the substrate processing apparatus 100 according to the first embodiment of the present invention, whereby a detailed description for the same parts will be omitted.

The electrode unit 430 may include a plurality of plasma forming spaces (S1), a plurality of source gas distributing spaces (S2), and a purge gas distributing space (S3), wherein the purge gas distributing space (S3) may be prepared in between a pair of plasma forming spaces (S1) prepared in between a pair of neighboring source gas distributing spaces (S2). To this end, the electrode unit 430 may include a ground frame 310, a plurality of space forming members 220, a plurality of insulating members 230, a plurality of plasma electrode members 240, a reaction gas supply member 250, a source gas supply member 460, and a purge gas supply member 470. Except the ground frame 310, the source gas supply member 460 and the purge gas supply member 470, the remaining structures of the electrode unit 430 are the same as those of the electrode unit 130 shown in FIGS. 3 and 4, whereby a detailed description for the same parts will be omitted.

Except that the ground frame 310 includes a plurality of fourth gas supply holes 219 overlapping with the purge gas distributing space (S3), the ground frame 310 shown in FIGS. 11 and 12 is identical to the ground frame 210 shown in FIGS. 3 and 4, wherein a detailed description for the ground frame 310 will be omitted. That is, in case of the substrate processing apparatus 300 according to the second embodiment of the present invention, the source gas distributing space (S2) prepared in between a pair of plasma forming spaces (S1) prepared in between a pair of neighboring source gas distributing spaces (S2) in the ground frame 210 of FIGS. 3 and 4 may be used as the purge gas distributing space (S3), and the plurality of third gas supply holes 218 overlapping with the purge gas distributing space (S3) may be used as the fourth gas supply hole 219.

The source gas supply member 460 supplies source gas (SG), which is supplied from the source gas supplier 170, to the plurality of third gas supply holes 218 formed in the ground frame 310, whereby the source gas (SG) is distributed to each of the source gas distributing spaces (S2) through the plurality of third gas supply holes 218. To this end, the source gas supply member 460 may include a second main gas pipe 462, and a plurality of second branch gas pipes 464.

The second main gas pipe 462 penetrating through the electrode cover 140 is connected with the source gas supplier 170.

Each of the second branch gas pipes 464 is diverged from the second main gas pipe 462, and is then combined with the ground frame 310 while being communicated with the plurality of third gas supply holes 218 formed in the ground frame 310.

The purge gas supply member 470 supplies purge gas (PG), which is supplied from the purge gas supplier 380, to the plurality of fourth gas supply holes 219 formed in the ground frame 310, whereby the purge gas (PG) is distributed to each of the purge gas distributing spaces (S3) through the plurality of fourth gas supply holes 219. To this end, the purge gas supply member 470 may include a third main gas pipe 472, and a plurality of third branch gas pipes 474.

The third main gas pipe 472 penetrating through the electrode cover 140 is connected with the purge gas supplier 380.

Each of the third branch gas pipes 474 is diverged from the third main gas pipe 472, and is then combined with the ground frame 310 while being communicated with the plurality of fourth gas supply holes 219 formed in the ground frame 310.

The purge gas supplier 380 supplies the predetermined purge gas (PG) to each of the purge gas distributing spaces (S3) prepared in the electrode unit 430. To this end, the purge gas supplier 380 may be provided on an upper surface of the electrode cover 140 or outside the process chamber 110, and be communicated with the aforementioned purge gas supply member 470, whereby the purge gas (PG) may be provided to each of the purge gas distributing spaces (S3) of the electrode unit 430. In this case, the purge gas (PG) purges the source gas (SG) which is not deposited on the substrate (W), and/or remaining reaction gas (RG) which does not react with the source gas (SG). The purge gas may be at least any one kind of gas among fluorinated carbons (CF4), nitrogen (N2), argon (Ar), xenon (Ze) and helium (He).

Hereinafter, a substrate processing method using the substrate processing apparatus according to the third embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 430, and is then distributed toward a lower side for each of the source gas distributing spaces (S2), whereby the source gas (SG) is distributed onto the plurality of substrates (W) rotated in accordance with the rotation of the substrate support 120.

Then, plasma power is supplied to each of the plasma electrode members 240 prepared in the electrode unit 430, and the reaction gas (RG) is supplied to each of the plasma forming spaces (S1) so as to form the plasma for each of the plasma forming spaces (S1), whereby the reaction gas of the plasma state in the plasma forming space (S1) is formed toward the substrate (W). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby a predetermined thin film material is deposited on the substrate (W).

Thereafter, the purge gas (PG) is supplied to each of the purge gas distributing spaces (S3) prepared in the electrode unit 430, whereby the purge gas (PG) is distributed to a lower side for each of the purge gas distributing spaces (S3). Accordingly, the purge gas (PG) is distributed onto the plurality of substrates (W) rotated in accordance with the rotation of the substrate support 120. The purge gas (PG) purges the source gas (SG) which is not deposited on the substrate (W), and/or the remaining reaction gas (RG) which does not react with the source gas (SG).

In the above substrate processing apparatus and method, the steps for distributing the source gas (SG), forming the plasma and distributing the purge gas (PG) may be carried out at the same time, or may be carried out in sequence.

The above substrate processing apparatus and method according to the third embodiment of the present invention improves step coverage of the thin film material, facilitates to control quality of the thin film and improves use efficiency of the source gas (SG) and uniformity of the thin film material by spatially separating the plasma forming space (S1) and the source gas distributing space (S2) prepared in the electrode unit 430 arranged above an entire upper side of the substrate support 120 for rotating the plurality of substrates (W), and furthermore facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

Figure 13:
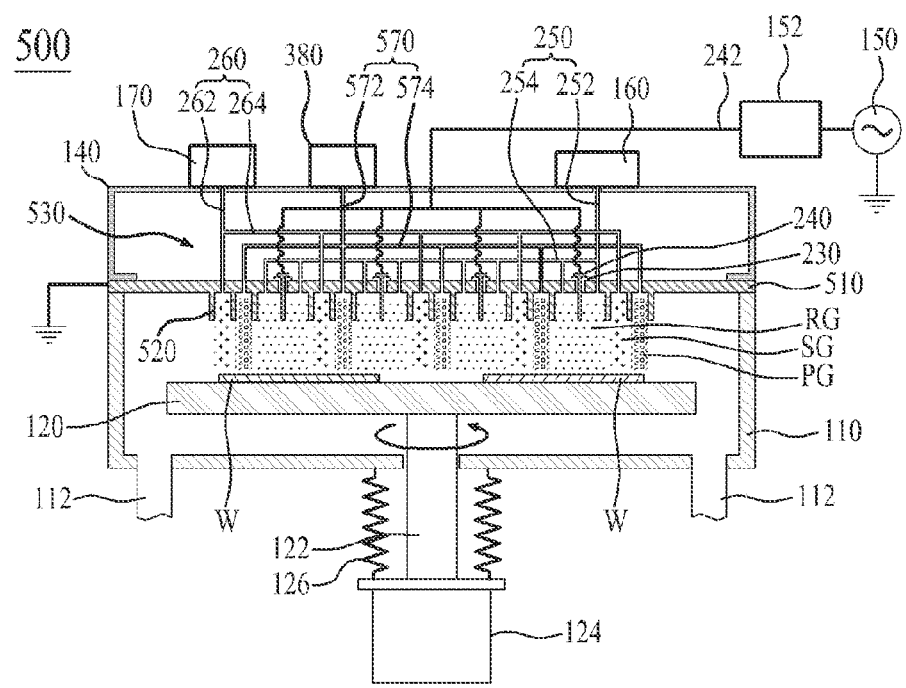
FIG. 13 illustrates a substrate processing apparatus according to the fourth embodiment of the present invention.
Figure 14:
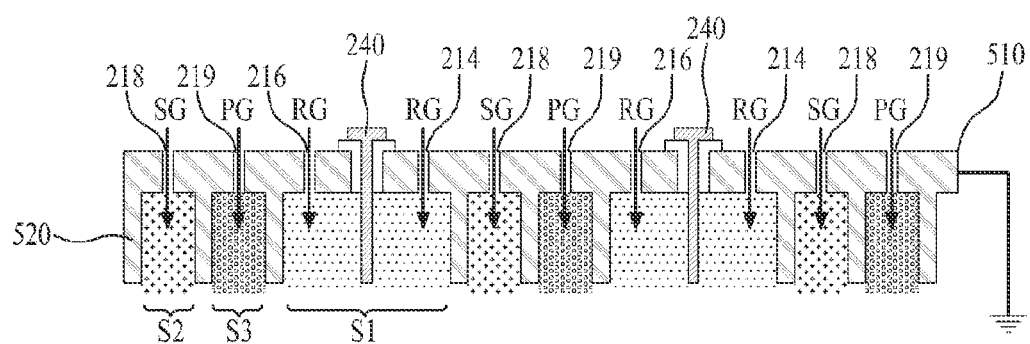
FIG. 14 is a cross sectional view showing some portions of a electrode unit shown in FIG. 13.

FIG. 13 illustrates a substrate processing apparatus according to the fourth embodiment of the present invention. FIG. 14 is a cross sectional view showing some portions of a electrode unit shown in FIG. 13.

Referring to FIGS. 13 and 14, the substrate processing apparatus 500 according to the fourth embodiment of the present invention may include a process chamber 110, a substrate support 120, a electrode unit 530, a electrode cover 140, a plasma power supplier 150, a reaction gas supplier 160, a source gas supplier 170, and a purge gas supplier 380. Except the electrode unit 530 and the purge gas supplier 380, the substrate processing apparatus 500 according to the fourth embodiment of the present invention is identical in structure to the substrate processing apparatus 100 according to the first embodiment of the present invention, whereby a detailed description for the same parts will be omitted.

The electrode unit 530 may include a plurality of plasma forming spaces (S1), a plurality of source gas distributing spaces (S2), and a plurality of purge gas distributing spaces (S3) prepared between the plasma forming space (S1) and the source gas distributing space (S2). To this end, the electrode unit 530 may include a ground frame 510, a plurality of space forming members 520, a plurality of insulating members 230, a plurality of plasma electrode members 240, a reaction gas supply member 250, a source gas supply member 260, and a purge gas supply member 570. Except the ground frame 510, the plurality of space forming members 520 and the purge gas supply member 570, the remaining structures of the electrode unit 530 are the same as those of the electrode unit 130 shown in FIGS. 3 and 4, whereby a detailed description for the same parts will be omitted.

Except that the ground frame 510 includes a plurality of fourth gas supply holes 219 which are formed between second and third gas supply holes 216 and 218 while being overlapped with the plurality of purge gas distributing spaces (S3), the ground frame 510 shown in FIGS. 13 and 14 is identical to the ground frame 210 shown in FIGS. 3 and 4, whereby a detailed description for the ground frame 510 will be omitted.

Except that each of the space forming members 520 protrudes with a predetermined height from a lower surface of the ground frame 510 so as to form the plurality of plasma forming spaces (S1), the plurality of source gas distributing spaces (S2) and the plurality of purge gas distributing spaces (S3), the plurality of space forming members 520 are identical to the plurality of space forming members 220 shown in FIGS. 3 and 4, wherein a detailed description for the same parts will be omitted.

The purge gas supply member 570 supplies the purge gas (PG), which is supplied from the purge gas supplier 380, to the plurality of fourth gas supply holes 219 formed in the ground frame 510, whereby the purge gas (PG) is distributed to the plurality of purge gas distributing spaces (S3) through the plurality of fourth gas supply holes 219. To this end, the purge gas supply member 570 may include a third main gas pipe 572, and a plurality of third branch gas pipes 574.

The third main gas pipe 572 penetrating through the electrode cover 140 is connected with the purge gas supplier 380.

Each of the third branch gas pipes 574 is diverged from the third main gas pipe 572, and is then combined with the ground frame 510 while being communicated with the plurality of fourth gas supply holes 219 formed in the ground frame 510.

The purge gas supplier 380 supplies the predetermined purge gas (PG) to each of the purge gas distributing spaces (S3) prepared in the electrode unit 530. To this end, the purge gas supplier 380 may be provided on an upper surface of the electrode cover 140 or outside the process chamber 110, and be communicated with the aforementioned purge gas supply member 570, whereby the purge gas (PG) may be provided to each of the purge gas distributing spaces (S3) of the electrode unit 530. In this case, the purge gas (PG) purges the source gas (SG) which is not deposited on the substrate (W), and/or the remaining reaction gas (RG) which does not react with the source gas (SG). The purge gas may be at least any one kind of gas among fluorinated carbons (CF4), nitrogen (N2), argon (Ar), xenon (Ze) and helium (He).

Hereinafter, a substrate processing method using the substrate processing apparatus according to the fourth embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 530, and is then distributed toward a lower side for each of the source gas distributing spaces (S2), whereby the source gas (SG) is distributed onto the plurality of substrates (W) rotated in accordance with the rotation of the substrate support 120.

Then, plasma power is supplied to each of the plasma electrode members 240 prepared in the electrode unit 530, and the reaction gas (RG) is supplied to each of the plasma forming spaces (S1) so as to form the plasma for each of the plasma forming spaces (S1), whereby the reaction gas of the plasma state in the plasma forming space (S1) is formed toward the substrate (W). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby a predetermined thin film material is deposited on the substrate (W).

Thereafter, the purge gas (PG) is supplied to each of the purge gas distributing spaces (S3) prepared in the electrode unit 530, whereby the purge gas (PG) is distributed to a lower side for each of the purge gas distributing spaces (S3). Thus, the purge gas (PG) is distributed onto the plurality of substrates (W) rotated in accordance with the rotation of the substrate support 120. The purge gas (PG) purges the source gas (SG) which is not deposited on the substrate (W), and/or the remaining reaction gas (RG) which does not react with the source gas (SG).

In the above substrate processing apparatus and method, the steps for distributing the source gas (SG), forming the plasma and distributing the purge gas (PG) may be carried out at the same time, or may be carried out in sequence.

The above substrate processing apparatus and method according to the fourth embodiment of the present invention improves step coverage of the thin film material, facilitates to control quality of the thin film and improves use efficiency of the source gas (SG) and uniformity of the thin film material by spatially separating the plasma forming space (S1) and the source gas distributing space (S2) prepared in the electrode unit 530 arranged above an entire upper side of the substrate support 120 for rotating the plurality of substrates (W), and furthermore facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

In the above substrate processing apparatuses and methods according to the first to fourth embodiments of the present invention, one kind of source gas (SG) is supplied to the plurality of source gas distributing spaces (S2), but not necessarily. For example, various kinds of source gas may be supplied to the respective source gas distributing spaces (S2). In this case, a multi-layered thin film including several layers formed of various thin film materials may be formed on the substrate (W).

Accordingly, the substrate processing apparatus and method according to the present invention improves step coverage of the thin film material and facilitates to control quality of the thin film by spatially separating the plasma forming space (S1) and the source gas distributing space (S2) from each other, and also improves use efficiency of the source gas (SG) and uniformity of the thin film material by preventing the thin film material from being deposited in the surroundings of plasma forming space (S1) and/or plasma electrode member or minimizing the deposition of thin film material in the surroundings of plasma forming space (S1) and/or plasma electrode member. Furthermore, the substrate processing apparatus and method according to the present invention facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing apparatus comprising:
   a process chamber;
   a substrate support for supporting a plurality of substrates, the substrate support rotatable provided inside the process chamber; and
   an electrode unit arranged above the substrate support and provided with a plurality of plasma forming spaces for forming plasma to the substrate and a plurality of source gas distributing spaces for distributing source gas onto the substrate, wherein the plasma forming spaces are spatially separated from the source gas distributing spaces,
   wherein the electrode unit includes:
   a ground frame being electrically grounded and provided to cover the process chamber; and
   a plurality of space forming members which protrude with a predetermined height from a lower surface of the ground frame toward the substrate support so as to spatially separate the plurality of plasma forming spaces and the plurality of source gas distributing spaces.

2. The substrate processing according to claim 1, wherein each source gas distributing space is formed between each of the plasma forming spaces so as to spatially separate the plurality of plasma forming spaces from one another.

3. The substrate processing apparatus according to claim 1, further comprising:
   a plasma power supplier for supplying plasma power to the plurality of plasma forming spaces;
   a reaction gas supplier for supplying reaction gas to the plurality of plasma forming spaces; and
   a source gas supplier for supplying source gas to the plurality of source gas distributing spaces.

4. The substrate processing apparatus according to claim 1, wherein the ground frame includes a plurality of insertion holes and a plurality of first and second gas supply holes being overlapped with the plurality of plasma forming spaces, and a plurality of third gas supply holes being overlapped with the plurality of source gas distributing spaces; and
   wherein the electrode unit further includes:
   a plurality of insulating members being inserted into the respective insertion holes;
   a plurality of plasma electrode members respectively positioned in the plurality of plasma forming spaces through the plurality of insulating members, and electrically connected with the plasma power supplier;
   a reaction gas supply member for supplying reaction gas, supplied from the reaction gas supplier, to the plurality of first and second gas supply holes; and
   a source gas supply member for supplying source gas, supplied from the source gas supplier, to the plurality of third gas supply holes.

5. The substrate processing apparatus according to claim 1, further comprising:
   a plasma power supplier for supplying plasma power to the plurality of plasma forming spaces;
   a reaction gas supplier for supplying reaction gas to the plurality of plasma forming spaces;
   a purge gas supplier for supplying purge gas to the plurality of plasma forming spaces; and
   a source gas supplier for supplying source gas to the plurality of source gas distributing spaces.

6. The substrate processing apparatus according to claim 1, wherein the ground frame includes a plurality of insertion holes and a plurality of first and second gas supply holes being overlapped with the plurality of plasma forming spaces, and a plurality of third gas supply holes being overlapped with the plurality of source gas distributing spaces;
   wherein the electrode unit further includes:
   a plurality of insulating members being inserted into the respective insertion holes;
   a plurality of plasma electrode members respectively positioned in the plurality of plasma forming spaces through the plurality of insulating members, and electrically connected with the plasma power supplier;
   a reaction gas supply member for supplying reaction gas, supplied from the reaction gas supplier, to at least one of the first and second gas supply holes;
   a purge gas supply member for supplying purge gas, supplied from the purge gas supplier, to the remaining one of the first and second gas supply hoes; and
   a source gas supply member for supplying source gas, supplied from the source gas supplier, to the plurality of third gas supply holes.

7. The substrate processing apparatus according to claim 1, wherein the electrode unit further includes a plurality of purge gas distributing spaces for distributing purge gas onto the substrate,
   wherein each of the purge gas distributing spaces is prepared in between a pair of plasma forming spaces prepared in between a pair of neighboring source gas distributing spaces.

8. The substrate processing apparatus according to claim 7, further comprising:
   a plasma power supplier for supplying plasma power to the plurality of plasma forming spaces;
   a reaction gas supplier for supplying reaction gas to the plurality of plasma forming spaces;
   a purge gas supplier for supplying purge gas to the plurality of plasma forming spaces; and
   a source gas supplier for supplying source gas to the plurality of source gas distributing spaces.

9. The substrate processing apparatus according to claim 1, wherein the ground frame includes a plurality of insertion holes and a plurality of first and second gas supply holes being overlapped with the plurality of plasma forming spaces, a plurality of third gas supply holes being overlapped with the plurality of source gas distributing spaces, and a plurality of fourth gas supply holes being overlapped with the plurality of purge gas distributing spaces;

wherein the plurality of space forming members spatially separate the plurality of plasma forming spaces, the plurality of source gas distributing spaces and the plurality of purge gas distributing spaces; and wherein the electrode unit further includes:

a plurality of insulating members being inserted into the respective insertion holes;

a plurality of plasma electrode members respectively positioned in the plurality of plasma forming spaces through the plurality of insulating members, and electrically connected with the plasma power supplier;

a reaction gas supply member for supplying reaction gas, supplied from the reaction gas supplier, to the plurality of first and second gas supply holes;

a source gas supply member for supplying source gas, supplied from the source gas supplier, to the plurality of third gas supply holes; and a purge gas supply member for supplying purge gas, supplied from the purge gas supplier, to the plurality of fourth gas supply holes.

10. The substrate processing apparatus according to claim 1, wherein the ground frame includes a plurality of insertion holes, and the electrode unit further includes a plurality of insulating members inserted into the respective insertion holes, and a plurality of plasma electrode members respectively positioned in the plurality of plasma forming spaces through the plurality of insulating members.

11. The substrate processing apparatus according to claim 10, further comprising a plasma power supplier for supplying plasma power to the plurality of plasma forming spaces, wherein the plurality of plasma electrode members are electrically connected with the plasma power supplier.

12. The substrate processing apparatus according to claim 1, wherein:

the ground frame includes a plurality of first and second gas supply holes overlapping with the plurality of plasma forming spaces, and a plurality of third gas supply holes overlapping with the plurality of source gas distributing spaces; and the electrode unit further includes a reaction gas supply member for supplying reaction gas to the plurality of first and second gas supply holes, and a source gas supply member for supplying source gas to the plurality of third gas supply holes.

13. The substrate processing apparatus according to claim 12, further comprising a reaction gas supplier for supplying reaction gas to the reaction gas supply member, wherein the gas supply member supplies reaction gas to the plurality of plasma forming spaces through the plurality of first and second gas supply holes.

14. The substrate processing apparatus according to claim 13, further comprising a source gas supplier for supplying source gas to the source gas supply member, wherein the source gas supply member supplies source gas to the plurality of source gas distributing spaces through the plurality of third gas supply holes.

* * * * *